(12) United States Patent
Carroll (10) Patent No.: US 7,369,077 B2
(45) Date of Patent: May 6, 2008

(54) DIFFERENTIAL CURRENT-STEERING DIGITAL-TO-ANALOG CONVERTER

(75) Inventor: Brian Stephen Carroll, Cambridge (GB)

(73) Assignee: Artimi, Inc., Santa Clara, CA (US)

( * ) Notice: Subject to any disclaimer, the term of this patent is extended or adjusted under 35 U.S.C. 154(b) by 0 days.

(21) Appl. No.: 11/519,201

(22) Filed: Sep. 12, 2006

(65) Prior Publication Data

US 2007/0252739 A1    Nov. 1, 2007

Related U.S. Application Data

(60) Provisional application No. 60/795,639, filed on Apr. 28, 2006.

(30) Foreign Application Priority Data

Apr. 28, 2006 (GB) .................... 0608375.2

(51) Int. Cl.
*H03M 1/80* (2006.01)
(52) U.S. Cl. ..................... 341/153; 341/144
(58) Field of Classification Search ............ 341/144, 341/136, 135, 118, 153; 323/315, 316
See application file for complete search history.

(56) References Cited

U.S. PATENT DOCUMENTS 4,683,458 A * 7/1987 Hallgren ............... 341/127
5,841,384 A 11/1998 Herman et al.
6,507,304 B1 1/2003 Lorenz
6,853,323 B1 * 2/2005 Chen et al. ............... 341/144
7,030,799 B2 * 4/2006 Lee et al. ............... 341/144

OTHER PUBLICATIONS

International Search Report Form PCT/ISA/206, PCT/GB2007/050217.

* cited by examiner

*Primary Examiner*—Peguy JeanPierre
(74) *Attorney, Agent, or Firm*—Knobbe, Martens Olson & Bear LLP (57) ABSTRACT

Differential, current-steering DACs with reduced small signal differential non-linearity. A set of binary-weighted steerable constant current generators is used in which each constant current generator comprises a ternary constant current generator configured to generate a three-state differential current in response to a ternary signal on a control input. Each ternary current generator is associated with a bit of the binary code. The DAC further comprises a code converter coupled between a digital input, to receive a signed digital value for conversion, and control inputs of the steerable current generators, to convert the binary input code to a ternary code to control the steerable current generators to provide a differential analogue output. In embodiments the smallest current source is $\frac{1}{2}I_0$ where $I_0$ is a change in differential output current caused by an lsb change in the binary input code.

20 Claims, 4 Drawing Sheets

DIFFERENTIAL CURRENT-STEERING DIGITAL-TO-ANALOG CONVERTER

CROSS REFERENCE TO RELATED APPLICATIONS

This application claims benefit under 35 U.S.C. §119 to UK Application No. 0608375.2, filed Apr. 28, 2006, and to U.S. Provisional Patent Application No. 60/795,639, filed Apr. 28, 2006, which are both incorporated herein by reference in their entireties.

BACKGROUND

1. Field of the Invention

This invention generally relates to digital-to-analogue converters (DACs). More particularly it relates to differential, current-steering DACs with reduced small signal differential non-linearity.

2. Related Art

Background references relating to current-steering DACs can be found in: US2003227402; US6853323; WO03021790; US6507304; US2003/001765; US2006/0012501; U.S. Pat. No. 6,967,609; WPO 2005/117402; US2005/0225465; U.S. Pat. No. 6,927,714; U.S. Pat. No. 6,833,801; US2004/0119621; U.S. Pat. No. 6,720,898; U.S. Pat. No. 6,703,956; U.S. Pat. No. 6,741,195; US2003/112164; US2003/001656; WO0215421; US2002/030619; U.S. Pat. No. 6,339,391; U.S. Pat. No. 5,909,187; U.S. Pat. No. 5,748,127; U.S. Pat. No. 5,463,394; EP0511858; WO01/67614; EP 0 251 758A; JP07-336227; and JP60-245315, which are all incorporated by reference herein in their entirety.

Figure 1:
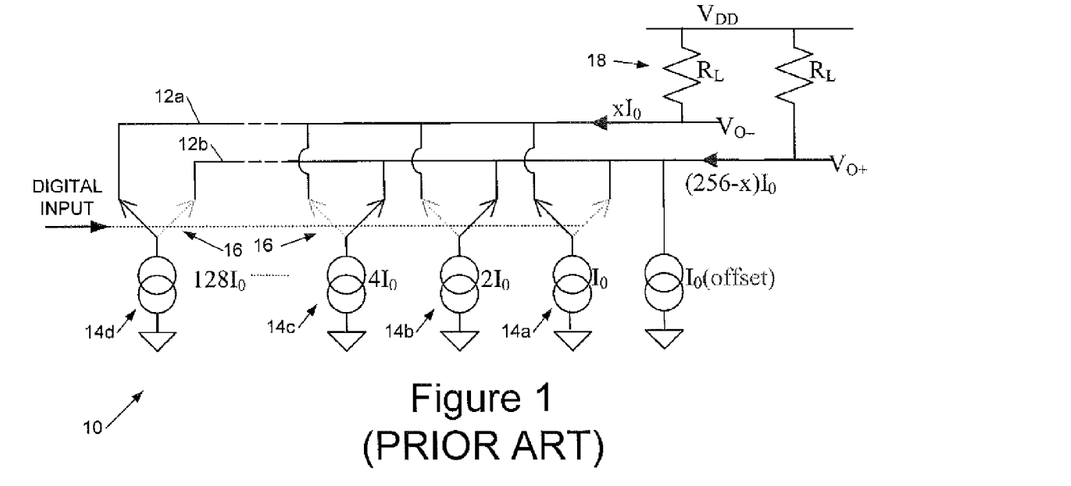
FIG. 1 shows a circuit diagram of a binary-weighted current-steering DAC.

FIG. 1 shows a circuit diagram of a binary weighted current-steering DAC 10. This is configured to convert an m-bit digital input word into a differential analogue output signal ($V_{O-}$, $V_{O+}$) on differential output line 12a, 12b. The DAC 10 includes a plurality of binary weighted current sinks 14a-d, each of value $2^i I_0$ where i runs from 0 to m. Each current sink has a respective switch 16 which switches the current between either the first or the second differential output line 12a, b responsive to the binary digital input signal, thus steering the current from each source to one or other of the two load resistors 18, thus forming a differential analogue signal at the output, in here a voltage signal. In this way each digital bit controls a current source which is weighted according to the significance of the controlling bit.

FIG. 1 shows the case of an 8 bit DAC architecture. In the diagram, the variable "x" represents an integer (binary digital value) between 0 and 255. $I_0$ is the value of the smallest current source. As shown above, a small offset current of $I_0$ may be included at the lower end of the DAC. This ensures zero differential output for x=128.

Table 1, below, shows how the digital value X maps to an output voltage in a differential current-steering DAC. The architecture shown in FIG. 1 can also be employed with a signed, twos complement digital data format with a simple logic change, that is inverting the MSB (most significant bit).

TABLE 1

| x | $V_{O+}$ | $V_{O-}$ | $V_{O+} - V_{O-}$ | $(V_{O+} - V_{O-})/2I_0R_L$ |
|---|---|---|---|---|
| 255 | $V_{DD} - I_0R_L$ | $V_{DD} - 255I_0R_L$ | $254I_0R_L$ | 127 |
| 254 | $V_{DD} - 2I_0R_L$ | $V_{DD} - 254I_0R_L$ | $252I_0R_L$ | 126 |
| 253 | $V_{DD} - 3I_0R_L$ | $V_{DD} - 253I_0R_L$ | $250I_0R_L$ | 125 |
| ... | ... | ... | ... | ... |
| 129 | $V_{DD} - 127I_0R_L$ | $V_{DD} - 129I_0R_L$ | $2I_0R_L$ | 1 |
| 128 | $V_{DD} - 128I_0R_L$ | $V_{DD} - 128I_0R_L$ | 0 | 0 |
| 127 | $V_{DD} - 129I_0R_L$ | $V_{DD} - 127I_0R_L$ | $-2I_0R_L$ | -1 |
| ... | ... | ... | ... | ... |
| 2 | $V_{DD} - 253I_0R_L$ | $V_{DD} - 2I_0R_L$ | $-252I_0R_L$ | -126 |
| 1 | $V_{DD} - 254I_0R_L$ | $V_{DD} - I_0R_L$ | $-254I_0R_L$ | -127 |
| 0 | $V_{DD} - 255I_0R_L$ | $V_{DD}$ | $-256I_0R_L$ | -128 |

We next discuss linearity errors.

In a real implementation, the values of the current sources will be subject to fine tolerances. This produces errors in the output levels. There are two measurements commonly used to quantify the errors-integral non-linearity (INL) and differential non-linearity (DNL). These are defined in terms of the deviation of the DAC transfer function from a straight line. (The straight line is generated either by a least-squares method or by end-point fitting. The gain error is treated as a separate specification).

Definitions:

| | |
|---|---|
| LSB | The average voltage step produced by changing the digital input value by 1 (i.e the slope of the transfer function). Stands for "Least Significant Bit". |
| DNL | The worst-case error in the size of the voltage or current step between any two adjacent codes. Always normalised to 1 LSB. |
| INL | The worst-case deviation of the transfer function from the ideal straight line. Always normalised to 1 LSB. |

INL and DNL are different ways of looking at the same errors, and they contain essentially the same information. Here it is convenient to focus on DNL errors. For more information on INL and DNL, reference may be made to Dan Sheingold, Analog-Digital Conversion Handbook, 3rd Edition, Analog Devices and Prentice-Hall, 1986, ISBN-0-13-032848-0.

A plot of the DNL error at each input code follows a distinctive patter. The worst error is usually at the "major bit transition", which occurs at the centre of the DAC range. The significance of this is discussed later.

In the 8-bit case, this is the transition from 127 to 128:

| Decimal | Binary |
|---|---|
| 127 | 01111111 |
| 128 | 10000000 |

In the binary DAC of FIG. 1, all currents are redirected from one output terminal to the other at this transition. This means that all the errors added together, and the total error can be very large. Of course it is also possible that the errors will cancel each other out, since this is a statistical process. However a practical design should aim to ensure that the total error is acceptably small for a large percentage of die; 3σ limits are typically used.

We next consider RF (Radio Frequency) communications systems, and in particular OFDM (Orthogonal Frequency Division Multiplexed) communications systems. Further reference may be made to standard ECMA-368, First Edition, 2005 "High Rate Ultra Wide Band PHY and MAC standard", which specifies the UWB (Ultra Wide Band) physical layer and medium access control layer for a high speed short range wireless network using the spectrum between 3.1 GHz and 10.6 GHz. This document is hereby incorporated by reference. In this UWB standard a multi-Band OFDM (MB-OFDM) scheme is used to transmit information with frequency-domain spreading, time-domain spreading and forward error correction (FEC) coding.

Broadly speaking in an OFDM communications system data is carried on a set of substantially mutually orthogonal sub-carriers, which together comprise an OFDM symbol. Because multiple sub-carriers are employed the effective data rate on each sub-carrier is relatively low. Because the sub-carriers are orthogonal they can overlap in frequency and still be separated at the receiver—this is because, in effect, during an integration over the period of one sub-carrier, the other sub-carriers averaged zero.

To generate an OFDM symbol an inverse Fourier transform is performed on a set of input symbols, the sub-carriers are orthogonal if they are spaced apart in frequency by an interval of 1/T, where T is the OFDM symbol period. At the receiver the input symbols can be recovered by performing a Fourier transform. A range of sub-carrier modulation schemes may be employed, for example PAM (Pulse Amplitude Modulation) and PSK (Phase Shift Keying), although commonly, and in the aforementioned UWB systems, QAM (Quadrature Amplitude Modulation) is employed. To reduce the effects of multipath OFDM symbols are normally extended by a guard period at the start or end of each symbol so that no ISI (Inter Symbol Interference) or ICI (Inter-Carrier Interference) will occur between signals with a difference in propagation time less than this guard period.

Figure 2A:
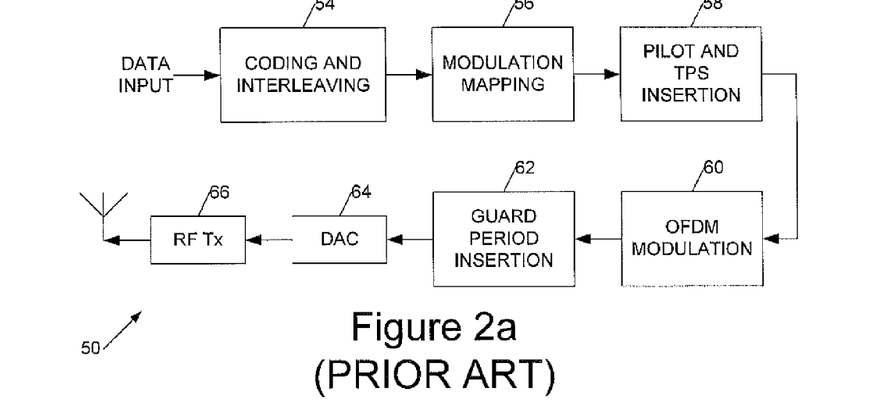

FIG. 2a shows a simplified block diagram of a OFDM transmitter 50 of the general type employed in many communications systems including UWB communications systems. An initial data stream is fed to a coding and interleaving stage 54 which performs outer Reed-Solomon coding and interleaving and inner convolutional coding and interleaving. QAM modulation mapping 56 is then performed and the pilot tones and TPS (Transmission Parameter Signalling) data (which specifies parameters such as modulation type, guard interval and inner code rates) are then inserted 58. OFDM modulation 60 is then performed, typically by serial-to-parallel conversion, an Inverse Fast Fourier Transform (IFFT) and subsequent parallel-to-serial conversion. The guard period is then inserted 62 by adding a cyclic prefix to the OFDM symbol and the signal is passed to a digital-to-analogue converter 64, which provides an analogue output to an RF output stage 66.

Figure 2B:
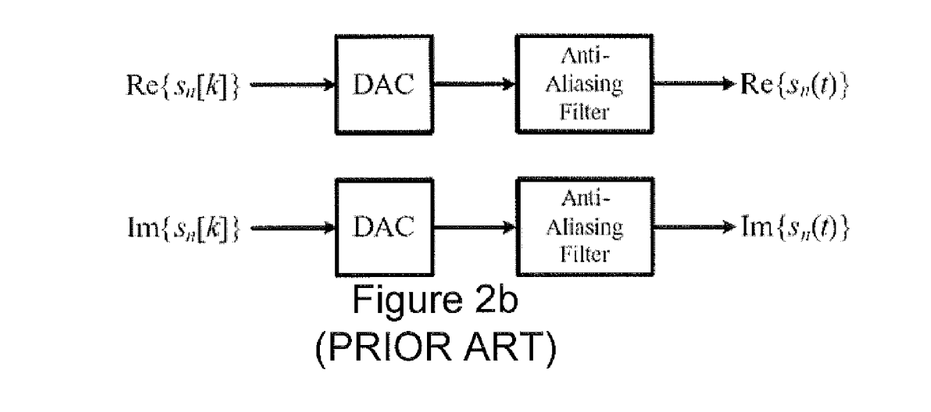

FIG. 2b, which is taken from FIG. 4 of standard ECMA-368, shows conversion from discrete time signals to continuous time signals in more detail showing that a pair of DACS, for real and imaginary components of the signal, may be employed together with anti-aliasing filters as indicated.

We next analyze the DAC stage of an OFDM system by considering some assume characteristics of the transmitted OFDM signal.

1. The digital baseband signal contains no DC component. Its amplitude varies symmetrically about zero.

2. The peak-to-average ratio can be large—i.e. it is likely that, at any given moment in time, the signal will be close to zero.

The first assumption suggests biasing the signal at the centre of the DAC range. This is simply a matter of adding 128 to the digital input signal. However, the worst-case static error in the DAC is at the transition from 127 to 128 and this centres the signal at the worst possible place in the transfer function. Further according to assumption (2) above, the signal is likely to spend a lot of time in this region.

SUMMARY

According to a first aspect of the invention there is provided a differential current-steering digital-to-analogue converter (DAC), the DAC comprising: a digital input to receive a binary code comprising a plurality of bits defining a signed digital value for conversion into a signed differential analogue output signal; a pair of differential analogue output lines to provide said differential analogue output; and a set of binary-weighted steerable substantially constant current generators each coupled to said differential output lines and having a control input to receive a signal derived from said digital input to control current steering to said differential output lines responsive to said binary input code; wherein a said steerable substantially constant current generator comprises a ternary substantially constant current generator configured to generate a three-state differential current in response to a ternary signal on said control input; and wherein each of said ternary current generators is associated with a bit of said binary code; and wherein said DAC further comprises a code converter coupled between said DAC digital input and said control inputs of said steerable current generators to convert said binary input code to a ternary code to control said steerable current generators.

In embodiments use of ternary constant current generators, which may be either current sources or current sinks, enables the major transition to be moved away from the centre. This is particularly advantageous for a DAC in an OFDM signal because the OFDM signal spends much of its time near the centre of the range. Thus embodiments of the invention are particularly useful in an OFDM transmitter.

Preferably a ternary current generator is implemented using a pair of constant current generators configured to generate substantially equal currents, in conjunction with switching circuitry to selectively connect each of the current generators to a selected one of different output lines responsive to the ternary control input signal. In embodiments the ternary signal has values of +1, 0 and −1 corresponding to, positive substantially zero and negative differential current value contributions to the output.

In embodiments the switching control circuitry comprises a pair of switches, one switch for each current generator of the pair of current generators. The ternary signal may then comprise a pair of binary bits on two control lines, one for each switch. The code converter to translate between the binary digital input and the control inputs of the steerable current generators, that is the ternary control signals, may either be implemented using a look-up table or using logic. As will be seen later, the patterns to be generated are relatively straightforward and approximate simple counting so that an implementation in combinatorial logic may be relatively simple and straightforward.

In preferred embodiments a ternary constant current generator is configured to steer substantially equal first and second currents to each of the differential output lines in response to a zero value of the ternary signal. In this way the differential contribution to the output current is zero. In practice, however, the two currents may not be exactly matched and because of this there may be a small difference in the differential output between steering the first current to the first differential output line and the second current to the second differential output line and the first current to the second differential output line and the second current to the first differential output line. Thus, there can be two different ways of encoding a zero value. Preferably, therefore, the code converter is configured to encode at least one of the ternary codings so that these errors are distributed substantially symmetrically about an overall differential zero output from the DAC. Consider two signed digital values of equal magnitude and opposite sign each represented by a set of ternary values at least one of the ternary values (for both the positive and negative signed digital values) being zero. By coding this zero using alternative codings for the two oppositely signed digital values, the alternative codings steering the substantially equal first and second currents to opposite lines of the pair of differential output lines, a small error from the first and second currents not being exactly equal is symmetrically distributed about an overall (differential) zero value output from the DAC. This may be considered as encoding a binary zero as either a +0 (corresponding, say, to +1, −1) or a −0 (corresponding, say, to −1, +1). The +0 gives rises to, say, an error of +Δ whilst the −0 gives rise to an error of, say, −Δ. The code converter may thus be configured to map input binary codes to ternary values including both a +0 and a −0 code to at least partially symmetrically distribute the errors about zero DAC output. In other variants the choice of a +0 or −0 code to employ to represent a ternary zero may at least in some instances, be made on a substantially random basis. In this way the errors may be noise coded to reduce their effect.

In some preferred embodiments the above described techniques are employed to encode one or more least significant bits (LSBs) of the DAC and one or more most significant bits of the DAC are thermometer encoded. The thermometer encoding circuitry may comprise a plurality of substantially constant current generators of substantially equal magnitude, each with a switch to selectively connect it to one or other of the differential output lines. Preferably an even number of constant current generators is employed so that half can be switched to one of the differential output lines and half to the other differential output line to provide a zero output (that is, without an offset). The magnitude of each of these constant current generators is preferably half that of a LSB change in the DAC output (referring to the least significant thermometer coded bit).

In preferred embodiments, each of the differential output lines is coupled to a load resistance, to provide a differential voltage output. However, in other embodiments other output configurations may be employed.

For example in an OFDM (or other) RF communications system a transimpedance circuit such as a transimpedance amplifier or filter may be coupled in some preferred high speed configurations, the output of the DAC comprises a pair of transmission lines coupled to the differential output lines, preferably with a suitable termination. The DAC may be fabricated using MOS (metal oxide semiconductor) technology, for example CMOS or NMOS technology, and in embodiments, the transmission lines may be coupled to further analogue circuitry fabricated, for example, on an SiGe technology die. In the context of an RF communications system digital RF circuitry such as an OFDM modulator may be fabricated on the MOS technology die and an RF output stage on the SiGe technology die. As previously mentioned, embodiments of the DAC are particularly suitable for processing an OFDM signal because such a signal tends to remain close to the centre of its range and by moving the worst-case error away from the centre of the range performance may be improved. Although additional switches and some code conversion logic is required, the overall increase in size and power consumption (from the switching) need not be large.

In a second, related aspect the invention provides a differential current-steering digital-to-analogue converter (DAC), the DAC comprising: a digital input to receive a binary code comprising a plurality of bits defining a signed digital value for conversion into a signed differential analogue output signal; a pair of differential analogue output lines to provide said differential analogue output; a plurality of current binary-weighted sources or sinks; and a plurality of controllable switches connected to be controllable via said digital input; and wherein a pair of said current sources or sinks of substantially equal value is associated with each bit of a plurality of bits of said digital input, each current source or sink of said pair being coupled to a said controllable switch to controllably connect the current source or sink to a selected one of said output lines.

The invention further provides a method of reducing small signal differential non-linearity in a differential, current-steering DAC, the method comprising: inputting a binary code comprising a plurality of bits defining a signed digital value for conversion into a signed differential analogue output signal: determining a ternary code from said binary code, said ternary code having a ternary digit for each bit of said binary code; and controlling the DAC current-steering using said ternary code; and wherein, for a substantially zero differential output from said DAC, a first set of binary-weighted substantially constant current generators drives a first differential output line of said DAC and a second set of binary-weighted substantially constant current generators having substantially the same values as said first set drives a second differential output line of said DAC.

The invention still further provides a differential, current-steering DAC, the DAC comprising: means for inputting a binary code comprising a plurality of bits defining a signed digital value for conversion into a signed differential analogue output signal; means for determining a ternary code from said binary code, said ternary code having a ternary digit for each bit of said binary code; means for controlling the DAC current-steering using a said ternary code; and wherein for a substantially zero differential output from said DAC, a first set of binary-weighted substantially constant current generators drives a first differential output line of said DAC and a second set of binary-weighted substantially constant current generators, having substantially the same values as said first set drives a second differential output line of said DAC.

The invention still further provides a method of reducing noise when converting a digital signal to an analogue signal, said analogue signal having a range of values and signal characteristics defining, on average, time spent by said signal in a first part of said range relative to time spent in a second part of said range, said time spent by said signal in said first part of said range being greater than said time spent by said signal in said second part of said range, the method comprising reshaping a differential non-linearity error pattern of said conversion to move a proportion of differential non-linearity error from said first range to said second range of said analogue signal to thereby reduce said noise of said converting.

For example, broadly speaking an OFDM signal comprises a sum of sine waves with only occasional peaks. Thus in the case of an OFDM signal the first range preferably comprises a range to either side of a zero value of the OFDM signals (positive and negative), and the second range preferably comprises the values having an absolute value (this either positive or negative) greater than values of the first range. Preferably the digital-to-analogue converting employs a current steering technique.

In a related aspect the invention provides a converter for reduced noise converting of a digital signal to an analogue signal, said analogue signal having a range of values and signal characteristics defining, on average, time spent by said signal in a first part of said range relative to time spent in a second part of said range, said time spent by said signal in said first part of said range being greater than said time spent by said signal in said second part of said range, said converter being configured to reshape a differential non-linearity error pattern of said conversion to move a proportion of differential non-linearity error from said first range to said second range of said analogue signal to thereby reduce said noise of said converting.

In a still further aspect the invention provides an analogue-to-digital converter (ADC) incorporating a digital-to-analogue converter in accordance with any of the above-described aspects of the invention, optionally with one or more of the features of embodiments as described above, as described later, and/or as recited in any one or more of the claims. Such an ADC may comprise, for example, a flash or pipeline flash ADC, a successive approximation register (SAR) ADC, or an ADC based upon another type of architecture.

BRIEF DESCRIPTION OF THE FIGURES

These and other aspects of the invention will now be further described, by way of example only, with reference to the accompanying figures in which:

FIGS. 2a and 2b show, respectively, a block diagram of an OFDM transmitter and digital-to-analogue conversion from discrete to continuous time signals for the OFDM transmitter of FIG. 2a;

DETAILED DESCRIPTION

Broadly speaking we will describe a current-steering DAC in which a major transition for small signals at the zero point of a differential output is avoided, albeit at the cost of a slightly reduced negative range, for example from −128 to −127 for an 8-bit DAC. We will describe how the MSB transition may be avoided by rearranging the switches so that all the currents substantially cancel at the centre of the range. Further, the switches are arranged so that LSB switches are used to create small, preferably the smallest possible steps (transition-related errors) when moving away from the centre (0) of the range. Still further away from the centre, the MSB switches are toggled; this potentially creates larger errors but these are now out of the normal operating range, for example of an OFDM signal, or at least in a place where the signal is larger. The DAC is also useful in other RF communication systems for converting digitised to analogue RF, in particular in a transmitter.

We will describe the generation of three states (+1, 0, −1) for each "bit", and in embodiments this is implemented by splitting a bit into two differential switches each of the half the required size as follows: $+1=+\frac{1}{2}+\frac{1}{2}$; $0=-\frac{1}{2}+\frac{1}{2}$; $-1=-\frac{1}{2}-\frac{1}{2}$.

The counting scheme for a three bit example is as shown in the table below, "ternary bit" 0 switching a pair of current sources or sinks each of value $\frac{1}{2}I_0$, and "ternary bit" 1 switching a pair of current sources or sinks of value $1I_0$.

| Output | "Ternary bit" 1 | "Ternary bit" 0 |
|---|---|---|
| +3 = | +1 + 1 | +½ + ½ |
| +2 = | +1 + 1 | +½ − ½ |
| +1 = | +1 − 1 | +½ + ½ |
| 0 = | +1 − 1 | +½ − ½ |
| −1 = | +1 − 1 | −½ − ½ |
| −2 = | −1 − 1 | +½ − ½ |
| −3 = | −1 − 1 | −½ − ½ |

To facilitate understanding of the invention we first describe more details of an operation of a DAC of the type show in FIG. 1, in particular a 4-bit differential DAC. Referring to Table 2 below, this shows switch control signals for the DAC, each column representing a current source with the weighting indicated at the top.

TABLE 2

| 4 | 2 | 1 | 0.5 | 0.5 | $I_{TOTAL}$ | 3σ(DNL) |
|---|---|---|---|---|---|---|
| 1 | 1 | 1 | 1 | −1 | 7 | 0.129 |
| 1 | 1 | 1 | −1 | −1 | 6 | 0.224 |
| 1 | 1 | −1 | 1 | −1 | 5 | 0.129 |
| 1 | 1 | −1 | −1 | −1 | 4 | 0.342 |
| 1 | −1 | 1 | 1 | −1 | 3 | 0.129 |
| 1 | −1 | 1 | −1 | −1 | 2 | 0.224 |
| 1 | −1 | −1 | 1 | −1 | 1 | 0.129 |
| 1 | −1 | −1 | −1 | −1 | 0 | 0.500 |
| −1 | 1 | 1 | 1 | −1 | −1 | 0.129 |
| −1 | 1 | 1 | −1 | −1 | −2 | 0.224 |
| −1 | 1 | −1 | 1 | −1 | −3 | 0.129 |
| −1 | 1 | −1 | −1 | −1 | −4 | 0.342 |
| −1 | −1 | 1 | 1 | −1 | −5 | 0.129 |
| −1 | −1 | 1 | −1 | −1 | −6 | 0.224 |
| −1 | −1 | −1 | 1 | −1 | −7 | 0.129 |
| −1 | −1 | −1 | −1 | −1 | −8 | |

Notice that in the centre of the range, all switches change state (except for the 0.5LSB offset current, which never switches). This means that the largest DNL error occurs at the transition between output values −1 and 0. By comparison, only one switch changes state at the transition between −8 and −7, so the DNL error is small. (In Table 2 the 3σ DNL level is illustrative rather than exact, since the exact figures may vary between implementations).

The current source with the largest value will also have the largest error. For a MOS implementation, the following proportionality holds.

$$\sigma(I) \propto \sqrt{I}$$

where "I" represents the current value and "σ" denotes standard deviation. This relationship is used to compute the 3σ DNL values in Table 2. Each value is calculated from the sum of the variances of every current source that is switching, as shown below.

To calculate the relationship between the value of a current source and the standard deviation of its error, it is assumed that the current source is made using a MOS implementation and is part of a matched array.

$$I_D \propto \frac{W}{L} \quad \text{Equation 1}$$

$$\frac{\sigma(I_D)}{I_D} \propto \frac{1}{\sqrt{WL}} \quad \text{Equation 2}$$

In a matched array, all current sources will have the same length L. Treating L as a constant, the equations can be rewritten as follows.

$$I_D \propto W \quad \text{Equation 3}$$

$$\frac{\sigma(I_D)}{I_D} \propto \frac{1}{\sqrt{W}} \quad \text{Equation 4}$$

Now substituting Equation 3 into Equation 4, we get $$\frac{\sigma(I_D)}{I_D} \propto \frac{1}{\sqrt{I_D}} \quad \text{Equation 5}$$

This expression gives the relative error on each current source. The absolute error is $$\sigma(I_D) \propto \sqrt{I_D} \quad \text{Equation 6}$$

We now describe our improved switching scheme.

The DAC architecture involves the use of a three-state switching scheme, illustrated in Table 3 below which shows three-state switch control signals for a 4-bit system An implementation and expected DNL values are detailed later.

TABLE 3

| 4 | 2 | 1 | |
|---|---|---|---|
| 1 | 1 | 1 | 7 |
| 1 | 1 | 0 | 6 |
| 1 | 0 | 1 | 5 |
| 1 | 0 | 0 | 4 |

TABLE 3-continued

| 4 | 2 | 1 | |
|---|---|---|---|
| 0 | 1 | 1 | 3 |
| 0 | 1 | 0 | 2 |
| 0 | 0 | 1 | 1 |
| 0 | 0 | 0 | 0 |
| 0 | 0 | -1 | -1 |
| 0 | -1 | 0 | -2 |
| 0 | -1 | -1 | -3 |
| -1 | 0 | 0 | -4 |
| -1 | 0 | -1 | -5 |
| -1 | -1 | 0 | -6 |
| -1 | -1 | -1 | -7 |

With this approach the major bit transitions have been moved as far away from the centre as possible, and the range has been reduced by 1 code (15 instead of 16).

The three-state control signals are implemented by splitting each current into two halves and switching them separately, as illustrated in Table 4.

TABLE 4

| 0.5 | 0.5 | | |
|---|---|---|---|
| 1 | 1 | 1 | Full current goes to positive side |
| -1 | 1 | 0 | Half current goes to each side |
| 1 | -1 | 0 | Half current goes to each side |
| -1 | -1 | -1 | Full current goes to negative side |

In this implementation there are two possible "0" states. These will have equal and opposite error components (+ΔI and −ΔI), due to mismatch between the two "halves".

In theory, the zero state could be implemented by turning the current source off completely. However this can create practical problems in high-speed applications.

To understand a preferred practical implementation, we combine Table 3 and Table 4 to generate Table 5 which shows switch control signals for a 4-bit DAC:

TABLE 5

| 2 | 2 | 1 | 1 | 0.5 | 0.5 | $I_{TOTAL}$ | 3σ(DNL) | Ternary Code | | |
|---|---|---|---|---|---|---|---|---|---|---|
| 1 | 1 | 1 | 1 | 1 | 1 | 7 | 0.183 | +1 | +1 | +1 |
| 1 | 1 | 1 | 1 | -1 | 1 | 6 | 0.258 | -0 | +1 | +1 |
| 1 | 1 | 1 | -1 | 1 | 1 | 5 | 0.183 | +1 | +0 | +1 |
| 1 | 1 | 1 | -1 | -1 | 1 | 4 | 0.365 | -0 | +0 | +1 |
| 1 | -1 | 1 | 1 | 1 | 1 | 3 | 0.183 | +1 | +1 | +0 |
| 1 | -1 | 1 | 1 | -1 | 1 | 2 | 0.258 | -0 | +1 | +0 |
| 1 | -1 | 1 | -1 | 1 | 1 | 1 | 0.183 | +1 | +0 | +0 |
| 1 | -1 | 1 | -1 | -1 | 1 | 0 | 0.183 | -0 | +0 | +0 |
| 1 | -1 | 1 | -1 | -1 | -1 | -1 | 0.258 | -1 | +0 | +0 |
| 1 | -1 | -1 | -1 | 1 | -1 | -2 | 0.183 | +0 | -1 | +0 |
| 1 | -1 | -1 | -1 | -1 | -1 | -3 | 0.365 | -1 | -1 | +0 |
| -1 | -1 | -1 | 1 | 1 | -1 | -4 | 0.183 | +0 | -0 | -1 |
| -1 | -1 | -1 | 1 | -1 | -1 | -5 | 0.258 | -1 | -0 | -1 |
| -1 | -1 | -1 | -1 | 1 | -1 | -6 | 0.183 | +0 | -1 | -1 |
| -1 | -1 | -1 | -1 | -1 | -1 | -7 | | -1 | -1 | -1 |

The switching scheme of table 5 can be implemented using a look-up table, or more preferably, using simple logic. (Again, in Table 2 the 3σ DNL levels are illustrative rather than exact).

In the switching (binary to ternary code translation) of Table 5:

Major bit transitions are pushed as far away as possible from zero.

Range reduced by 1LSB. This is still only 1LSB for 8-bit case. The code that disappears is often unused due to a symmetry requirement for + and − signals.

6 switches are used instead of 5. In general for N binary bits (including a sign bit) the architecture needs 2×(N−1)

Continuing to refer to table 5, it can be seen by examining the ternary code column of the table that for the middle ternary bit two different binary codes are employed to create a 0, "+0" and "−0" (highlighted) so that the error between the current generators is symmetrical about the total 0 current row of the table. The table, which is relatively small, shows only one example of this but the skilled person will readily appreciate how the principle may be extended to longer ternary codes (DACs) of greater than 4-bits.

Figure 3:
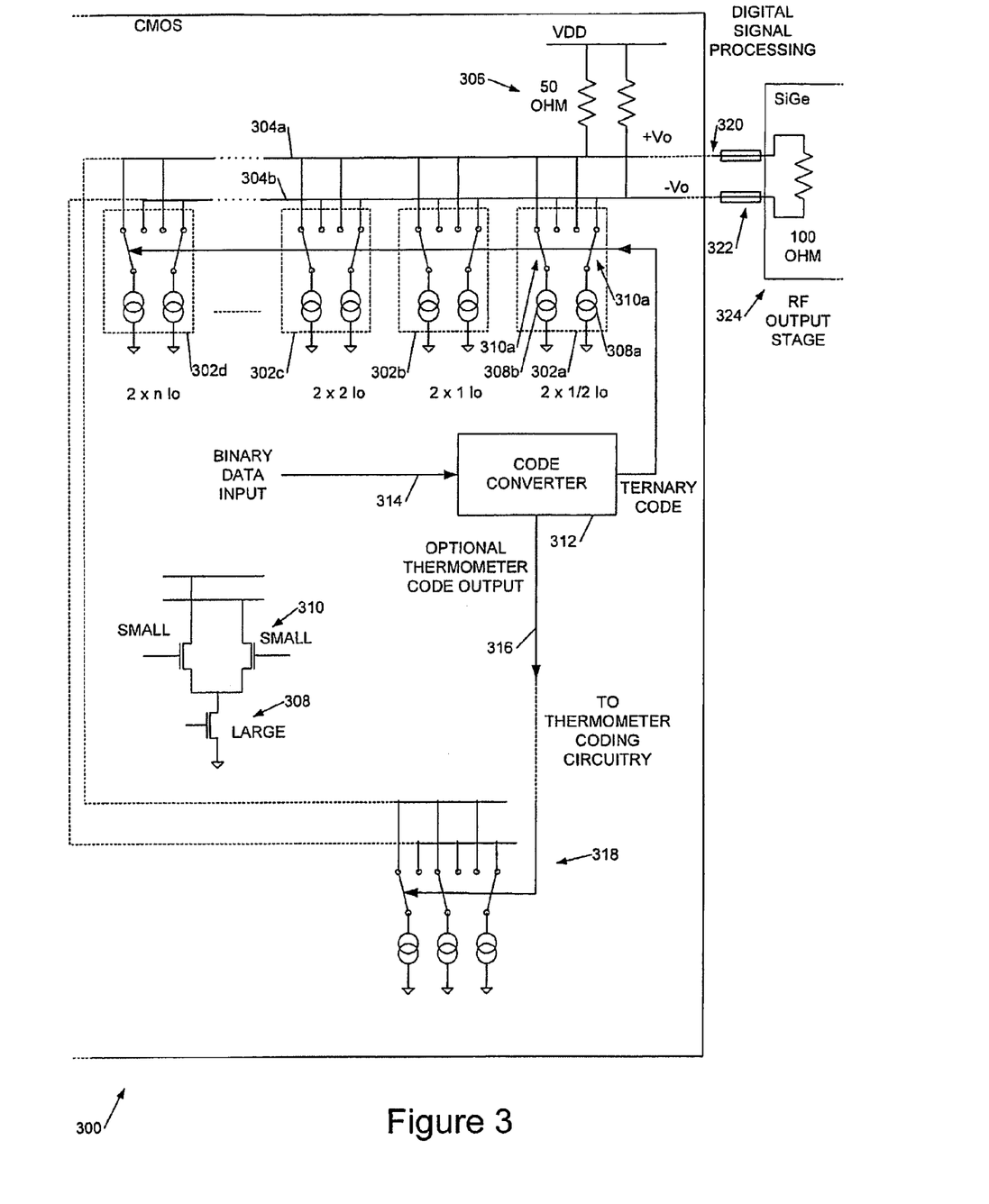
FIG. 3 shows a binary-weighted current-steering DAC according to an embodiment of the present invention.

Referring now to FIG. 3, this shows an embodiment of a current-steering binary-weighted DAC 300 employing ternary current generators, according to an embodiment of the invention. The DAC 300 comprises a plurality of ternary current generators 302a-d each coupled to a pair of differential output lines 304a, b coupled to respective load resistances 306. Each current generator 302 comprises a pair of substantially matched current generators 308a, b each coupled to a respective switch 310a,b for connecting the current generator to a selected one of the differential output lines 304. The inset in FIG. 3 shows implementation of a current generator and associated switch in MOS technology. As illustrated the DAC produces a voltage output but, depending upon the application, a transimpedance circuit such as a transimpedance amplifier or filter may be coupled to the output of the DAC and/or the current output may be employed directly.

The switches 310 are controlled in accordance with a ternary code output from code convertor 312 which, in this described example, implements the logic of table 5 to convert binary data on DAC input 314 to a ternary code for controlling switches 310. For a larger number of bits the skilled person will readily appreciate how the logic of table 5 may be extended, adding one or more additional "ternary bits". Optionally, as described later, the code convertor 312 also provides a thermometer code output 316 to control thermometer coding circuitry 318 as illustrated. In the thermometer coding circuitry all the current sources or sinks have substantially the same value and the number of current sources or sinks switched accord to the number represented by the binary input date bits for thermometer coding. Examples of the coding logic are described below.

In embodiments the DAC 300 may operate at a very high speed, for example greater than 1 GHz, 2 GHz, 5 GHz or 10 GHz. The DAC may thus be employed to generate an analogue signal at baseband or, more particularly at an intermediate frequency (IF). Thus in embodiments the DAC 300 may be implemented in CMOS and an analogue output 320 of the DAC may be provided via a pair of transmission lines 322, to a SiGe technology circuit 324 (or to a circuit employing other high frequency technology such as GaAs). This may provide a termination for the transmission line and may implement RF circuitry such as an RF output stage. Since CMOS and SiGe technologies are compatible with one another, in some preferred embodiments the SiGe circuitry is fabricated alongside the CMOS circuitry, preferably (but optionally) on a common substrate. In other embodiments however the RF circuitry may also be implemented using MOS technology such as RF CMOS.

The operation of the DAC 300 of FIG. 3 has already been described above. By way of illustration, in the example shown since switches 310a, b are illustrated as directing one of current generators 308a, b to each of the differential output line 304, DAC 300 is, in FIG. 3, shown as providing a zero overall output. A count of 1 is provided by changing a position of 1 of switches 310a, b, to reduce the current in one of the differential output lines by ½I0 and to increase the current flowing in the differential output line by ½I0 giving a total change in the differential output of 1I0.

Most of the discussion so far has been focused on 4-bit DACs. While this is convenient for explanatory purposes, it is an impractically low resolution in many applications. The technique can readily be extended to 5 or more bits but the larger current sources/sinks, if implemented using larger transistors, require larger silicon area. For moderate to high resolutions (say 7 bits or more), the matching requirements for the DAC start to become expensive in silicon area.

The impact of mismatch on a DAC can be reduced by thermometer encoding. In this type of DAC coding the currents are all equal rather than binary weighted, as shown below for a three-bit thermometer code unsigned.

TABLE 6

| Decimal | Binary code | Thermometer code |
| --- | --- | --- |
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |

Compared to binary weighting, this technique uses a larger number of smaller current sources. This eases the matching requirement and reduces the silicon area of the current sources. This is because the matching accuracy is governed by the ratio of the largest and the smallest current generator, and with thermometer coding the biggest current generator is smaller than with binary weighting. The penalty is an increase in the number of switches.

Figure 4:
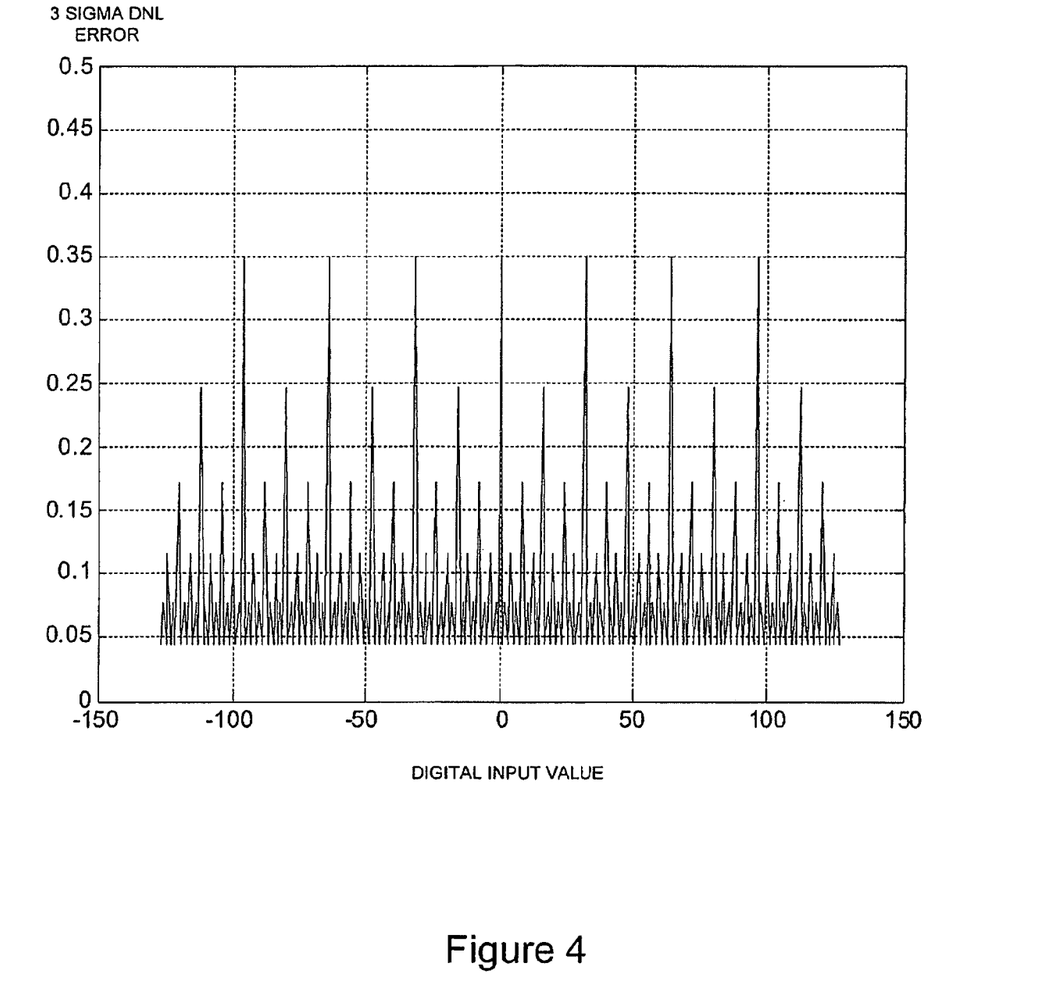
FIG. 4 shows a differential non-linearity (DNL) pattern for an 8-bit binary-weighted current-steering DAC with three MSBs thermometer encoders.

In some preferred embodiments DAC design uses a combination of the thermometer code and the binary code in order to optimise the trade-off between current-source area and switch area. For example, an 8-bit DAC may use thermometer encoding for the upper 3 bits and binary coding for the remaining 5 bits. The DNL pattern for such a DAC is shown in FIG. 4.

It is also possible to rearrange the thermometer encoded DAC such that its transitions are (as far as possible) away from the centre. It is convenient to work in a signed number system rather than the unsigned system of Table 6. However, a three-state switching scheme is not required. Table 7, below, shows a signed three-bit thermometer code.

TABLE 7

| 0.5 | 0.5 | 0.5 | 0.5 | 0.5 | 0.5 | |
| --- | --- | --- | --- | --- | --- | --- |
| 1 | 1 | 1 | 1 | 1 | 1 | 3 |
| 1 | 1 | 1 | 1 | 1 | −1 | 2 |
| 1 | 1 | 1 | 1 | −1 | −1 | 1 |
| 1 | 1 | 1 | −1 | −1 | −1 | 0 |
| 1 | 1 | −1 | −1 | −1 | −1 | −1 |
| 1 | −1 | −1 | −1 | −1 | −1 | −2 |
| −1 | −1 | −1 | −1 | −1 | −1 | −3 |

Figure 5:
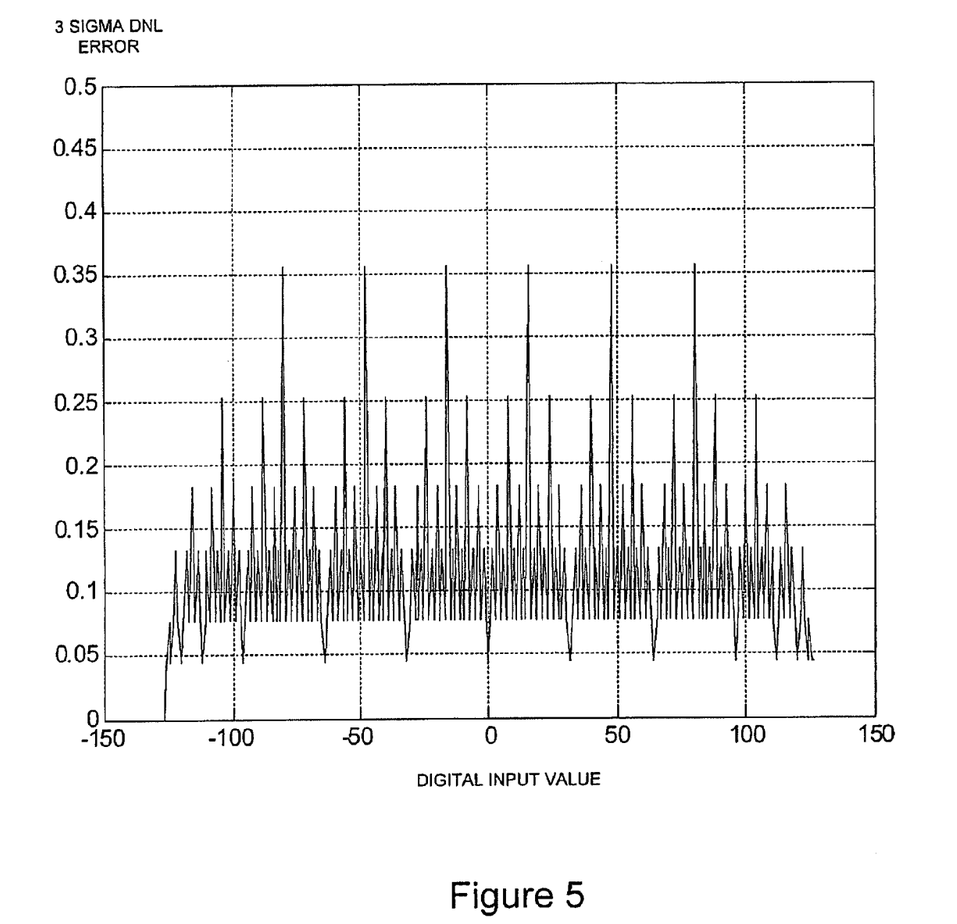
FIG. 5 shows a DNL pattern for an 8-bit DAC according to an embodiment of the invention with 3 MSBs thermometer encoders.

The DNL pattern for an 8-bit DAC employing ternary binary-weighted current generators is previously described with the three MSBs thermometer encoded is shown in FIG.

5. This would use 14 current generators (6 for the thermometer coding and 8 for the binary-weighted ternary coding).

The skilled persons will understand that a DAC as described above may also be incorporated into an ADC. For example, in an SAR ADC the analogue input is provided to a comparator and compared with the output of DAC which has a digital input from the SAR, controlled by the comparator output so that the digital output of the DAC converges on the analogue input, the digital input to the DAC providing the digital output of the ADC. Alternatively a sigma-delta architecture may be employed using a multibit DAC in the feedback loop. In a still further alternative a pipeline ADC architecture may be employed using a DAC as described above, in particular with sub-ranging in which a coarse multibit MSB conversion is converted back to an analogue signal using a multibit DAC and then subtracted from the analogue input (after a sample-and-hold), the residue or each residue being converted in the or each next stage of the pipeline (optionally after amplifying the residue). Embodiments of the DAC described above may also, advantageously, be incorporated into other ADC architectures.

No doubt many effective alternatives will occur to the skilled person. For example although we have described switch control schemes for a ones complement binary data input the skilled person will appreciate that twos complement binary data may also be employed. It will be understood that the invention is not limited to the described embodiments and encompasses modifications apparent to those skilled in the art lying within the spirit and scope of the claims appended hereto.

What is claimed is:

1. A differential current-steering digital-to-analogue converter (DAC), the DAC comprising:
a digital input to receive a binary code comprising a plurality of bits defining a signed digital value for conversion into a signed differential analogue output signal;
a pair of differential analogue output lines to provide said differential analogue output; and
a set of binary-weighted steerable substantially constant current generators each coupled to said differential output lines and having a control input to receive a signal derived from said digital input to control current steering to said differential output lines responsive to said binary input code;
wherein a said steerable substantially constant current generator comprises a ternary substantially constant current generator configured to generate a three-state differential current in response to a ternary signal on said control input;
wherein each of said ternary current generators is associated with a bit of said binary code; and
wherein said DAC further comprises a code converter coupled between said DAC digital input and said control inputs of said steerable current generators to convert said binary input code to a ternary code to control said steerable current generators.

2. A differential current-steering DAC as claimed in claim 1 wherein a said ternary current generator associated with a bit of said binary code comprises a pair of substantially constant current generators configured to generate substantially equal currents, coupled to said ternary signal control input to selectively connect each of said pair of current generators to a selected one of said differential output lines responsive to said ternary control input signal.

3. A differential current-steering DAC as claimed in claim 2 wherein said switching circuitry comprises a pair of switches, one for each of said pair of current generators, and wherein said ternary signal comprises a pair of binary bits, said current generator control input comprising two lines, one for each of said pair of binary bits, one said line controlling each switch of said pair of switches.

4. A differential current-steering DAC as claimed in claim 1 wherein said ternary signal has values of +1, 0, and −1 corresponding to positive, substantially zero, and negative three-state differential current values.

5. A differential current-steering DAC as claimed in claim 1 wherein a said steerable substantially constant current generator is configured to steer substantially equal first and second currents to each of said differential output lines responsive to a zero value of said ternary signal.

6. A differential current-steering DAC as claimed in claim 1 wherein a ternary value of said ternary code is represented by a pair of binary bits, each bit of said pair of bits steering one of said substantially equal currents, and wherein a ternary zero value is represented by first and second alternative values of said pair of binary bits steering said first and second currents to opposite lines of said pair of differential output lines, and wherein said code converter is configured to code corresponding said ternary zero values for two said signed digital values of equal magnitude and opposite signs using one of said alternative codings for one said sign and the other of said alternative codings for the other said sign.

7. A differential current-steering DAC as claimed in claim 1 wherein a said substantially constant current generator comprises a current sink.

8. A differential current-steering DAC as claimed in claim 1 further comprising thermometer encoding circuitry for a plurality of most significant bits of said DAC.

9. A differential current-steering DAC as claimed in claim 1 wherein said ternary current generator associated with a least significant bit (lsb) of said binary code is configured to generate a pair of currents each of value $\frac{1}{2}I_0$ where $I_0$ is a change in differential output current caused by an lsb change in said binary input code.

10. A differential current-steering DAC as claimed in claim 9 wherein said code converter is configured to convert a zero value of said signed digital value into a ternary code to steer one of said pair of currents to each of said differential output lines; wherein said code converter is configured to convert a +1 value of said signed digital value into a ternary code to steer a first of said pair of currents to a first of said differential output lines and a second of said pair of currents to a second of said differential output lines; wherein said code converter is configured to convert a −1 value of said signed digital value into a ternary code to steer a first of said pair of currents to a second of said differential output lines and a second of said pair of currents to a first of said differential output lines.

11. An RF circuit including a DAC as claimed in claim 1 coupled to an analogue RF stage, wherein said DAC is fabricated in MOS technology and wherein said analogue RF stage is fabricated in SiGe technology, both on a common substrate.

12. An OFDM transmitter including a digital OFDM modulator to generate digital OFDM signal data, an analogue RF output stage, and a DAC as claimed in claim 1 coupled between said digital OFDM modulator and said analogue RF output stage to convert said digital OFDM modulator and said analogue RF output stage to convert said digital OFDM signal data to an analogue input signal to drive said RF output stage.

13. An RF circuit including an OFDM transmitter as claimed in claim 12, wherein said DAC is fabricated in MOS technology and wherein said analogue RF stage is fabricated in SiGe technology, both on a common substrate.

14. A differential current-steering digital-to-analogue converter (DAC), the DAC comprising:
- a digital input to receive a binary code comprising a plurality of bits defining a signed digital value for conversion into a signed differential analogue output signal;
- a pair of differential analogue output lines to provide said differential analogue output;
- a plurality of current binary-weighted sources or sinks; and
- a plurality of controllable switches connected to be controllable via said digital input; and
- wherein a pair of said current sources or sinks of substantially equal value is associated with each bit of a plurality of bits of said digital input, each current source or sink of said pair being coupled to a said controllable switch to controllably connect the current source or sink to a selected one of said output lines, and wherein said pair of current sources or sinks associated with a least significant bit (lsb) of said binary code is configured to generate a pair of currents each of value $\frac{1}{2}I_0$ where $I_0$ is a change in differential output current caused by an lsb change in said binary input code.

15. A differential current-steering DAC as claimed in claim 14 wherein said code converter is configured to convert a zero value of said signed digital value into a ternary code to steer one of said pair of currents to each of said differential output lines; wherein said code converter is configured to convert a +1 value of said signed digital value into a ternary code to steer a first of said pair of currents to a first of said differential output lines and a second of said pair of currents to a second of said differential output lines; wherein said code converter is configured to convert a −1 value of said signed digital value into a ternary code to steer a first of said pair of currents to a second of said differential output lines and a second of said pair of currents to a first of said differential output lines.

16. An RF circuit including a differential current-steering digital-to-analogue converter (DAC) coupled to an analogue RF stage, wherein said DAC comprises:
- a digital input to receive a binary code comprising a plurality of bits defining a signed digital value for conversion into a signed differential analogue output signal;
- a pair of differential analogue output lines to provide said differential analogue output;
- a plurality of current binary-weighted sources or sinks; and
- a plurality of controllable switches connected to be controllable via said digital input; and
- wherein a pair of said current sources or sinks of substantially equal value is associated with each bit of a plurality of bits of said digital input, each current source or sink of said pair being coupled to a said controllable switch to controllably connect the current source or sink to a selected one of said output lines; and wherein said DAC is fabricated in MOS technology and wherein said analogue RF stage is fabricated in SiGe technology, both on a common substrate.

17. An OFDM transmitter including a digital OFDM modulator to generate digital OFDM signal data, an analogue RF output stage, and a differential current-steering digital-to-analogue converter (DAC) coupled between said digital OFDM modulator and said analogue RF output stage to convert said digital OFDM modulator and said analogue RF output stage to convert said digital OFDM signal data to an analogue input signal to drive said RF output stage, said DAC comprising:
- a digital input to receive a binary code comprising a plurality of bits defining a signed digital value for conversion into a signed differential analogue output signal;
- a pair of differential analogue output lines to provide said differential analogue output;
- a plurality of current binary-weighted sources or sinks; and
- a plurality of controllable switches connected to be controllable via said digital input; and
- wherein a pair of said current sources or sinks of substantially equal value is associated with each bit of a plurality of bits of said digital input, each current source or sink of said pair being coupled to a said controllable switch to controllably connect the current source or sink to a selected one of said output lines.

18. An RF circuit including an OFDM transmitter as claimed in claim 17, wherein said DAC is fabricated in MOS technology and wherein said analogue RF stage is fabricated in SiGe technology, both on a common substrate.

19. A method of reducing small signal differential non-linearity in a differential, current-steering DAC, the method comprising:
- inputting a binary code comprising a plurality of bits defining a signed digital value for conversion into a signed differential analogue output signal;
- determining a ternary code from said binary code, said ternary code having a ternary digit for each bit of said binary code; and
- controlling the DAC current-steering using said ternary code; and
- wherein, for a substantially zero differential output from said DAC, a first set of binary-weighted substantially constant current generators drives a first differential output line of said DAC and a second set of binary-weighted substantially constant current generators having substantially the same values as said first set drives a second differential output line of said DAC.

20. A differential, current-steering DAC, the DAC comprising:
- means for inputting a binary code comprising a plurality of bits defining a signed digital value for conversion into a signed differential analogue output signal;
- means for determining a ternary code from said binary code, said ternary code having a ternary digit for each bit of said binary code;
- means for controlling the DAC current-steering using said ternary code; and wherein for a substantially zero differential output from said DAC, a first set of binary-weighted substantially constant current generators drives a first differential output line of said DAC and a second set of binary-weighted substantially constant current generators, having substantially the same values as said first set drives a second differential output line of said DAC.

* * * * *